United States Patent
Mertens et al.

(10) Patent No.: US 10,659,038 B1
(45) Date of Patent: May 19, 2020

(54) POWER ON RESET LATCH CIRCUIT

(71) Applicant: NXP USA, INC., Austin, TX (US)

(72) Inventors: Robert Matthew Mertens, Austin, TX (US); James Robert Feddeler, Lake Village, IN (US); Stefano Pietri, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/299,782

(22) Filed: Mar. 12, 2019

(51) Int. Cl.
*H03K 17/22* (2006.01)
*H03K 19/0185* (2006.01)
*H03K 3/356* (2006.01)
*H03K 3/037* (2006.01)

(52) U.S. Cl.
CPC .......... *H03K 17/223* (2013.01); *H03K 3/037* (2013.01); *H03K 3/356113* (2013.01); *H03K 19/018528* (2013.01)

(58) Field of Classification Search
None
See application file for complete search history.

(56) References Cited

U.S. PATENT DOCUMENTS

| | | | |
|---|---|---|---|
| 3,539,836 A * | 11/1970 | Seelbach | H03K 3/0372 327/202 |
| 5,345,422 A * | 9/1994 | Redwine | G11C 5/143 327/143 |
| 6,570,401 B2 | 5/2003 | Correale, Jr. et al. | |
| 6,753,697 B2 * | 6/2004 | Nakase | H03K 19/0013 326/56 |
| 6,781,413 B2 | 8/2004 | Kihara et al. | |
| 6,894,537 B1 | 5/2005 | Wert | |
| 7,804,327 B2 | 9/2010 | Jao et al. | |
| 8,063,662 B2 | 11/2011 | Foley et al. | |
| 8,598,939 B2 * | 12/2013 | Shimizu | G01S 7/52017 327/436 |
| 10,193,545 B1 * | 1/2019 | Pankratz | H03K 17/223 |
| 2006/0066381 A1 * | 3/2006 | Bhattacharya | H03K 3/356008 327/333 |
| 2008/0116945 A1 * | 5/2008 | Sugio | G06F 1/24 327/143 |
| 2008/0246526 A1 * | 10/2008 | Sahu | H03K 3/0375 327/198 |
| 2010/0164582 A1 * | 7/2010 | Ricotti | G01S 7/523 327/208 |
| 2018/0191340 A1 * | 7/2018 | Akahane | H03K 17/16 |
| 2019/0097633 A1 * | 3/2019 | Ullmann | H03K 19/0175 |
| 2019/0287633 A1 * | 9/2019 | Conte | G11C 8/08 |

* cited by examiner

*Primary Examiner* — Lincoln D Donovan
*Assistant Examiner* — Khareem E Almo

(57) ABSTRACT

A method of powering up a circuit includes powering up a latch circuit in a known latch state by applying a first power supply voltage differential of a first voltage domain across power supply terminals of the latch circuit. A current diode inhibits current diode in a current path between a latch node of the latch circuit and a power supply terminal when the power supply voltage differential is below a threshold voltage during the powering up in which the inhibiting prevents the latch circuit from switching from the known latch state during the powering up.

20 Claims, 3 Drawing Sheets

POWER ON RESET LATCH CIRCUIT

BACKGROUND

Field

This disclosure relates generally to integrated circuits, and more specifically, to a power on reset latch circuit.

Related Art

Chips today typically include many different power domains. To initialize a chip, though, a reliable reset signal is needed to properly reset the different power domains. This reliable reset signal is needed even during power up of the different power domains. Available today are reliable reset signals that are generated with an active power circuit of the chip. This ensures reliable reset signals, even upon power up, but the active power circuit, which is always "on," constantly consumes power. This is especially problematic in battery operated devices which require low power operation. Therefore, a need exists for a circuit which is capable of generating a reliable power on reset (POR) signal upon power up while minimizing power consumption.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

During power up, a POR latch circuit in a first voltage domain powers up to a known latch state and remains in the known latch state at least until a voltage supply of the first power domain reaches a minimum threshold value allowing for logic functionality of the POR latch. In one embodiment, a capacitively skewed latch ensures that, upon initial power up of the supply voltage, the latch is in a known state, and a diode coupled in series with one or both storage nodes of the latch ensures that the latch cannot be forced out of the known state as the voltage supply continues to power up to the minimum threshold value, at which point the diode can become conductive. In one embodiment, a level shifter having a first stage in a second voltage domain, different from the first voltage domain, and a second stage in the first voltage domain provides control signals from the second stage to control the storage nodes of the latch once a supply voltage of the second voltage domain is sufficiently powered up. Prior to the second voltage domain being sufficiently powered, though, the control signals are undefined and not reliable. Therefore, while the second voltage domain is powering up, keeper circuits ensure that the control signals output by the level shifter do not alter the known latch state of the latch. Once the second voltage domain is powered up, control signals output by the first stage of the level shifter to the second stage of the level shifter are defined and reliable, generated in response to a reliable POR input signal provided by a POR circuit in the second voltage domain.

Figure 1:
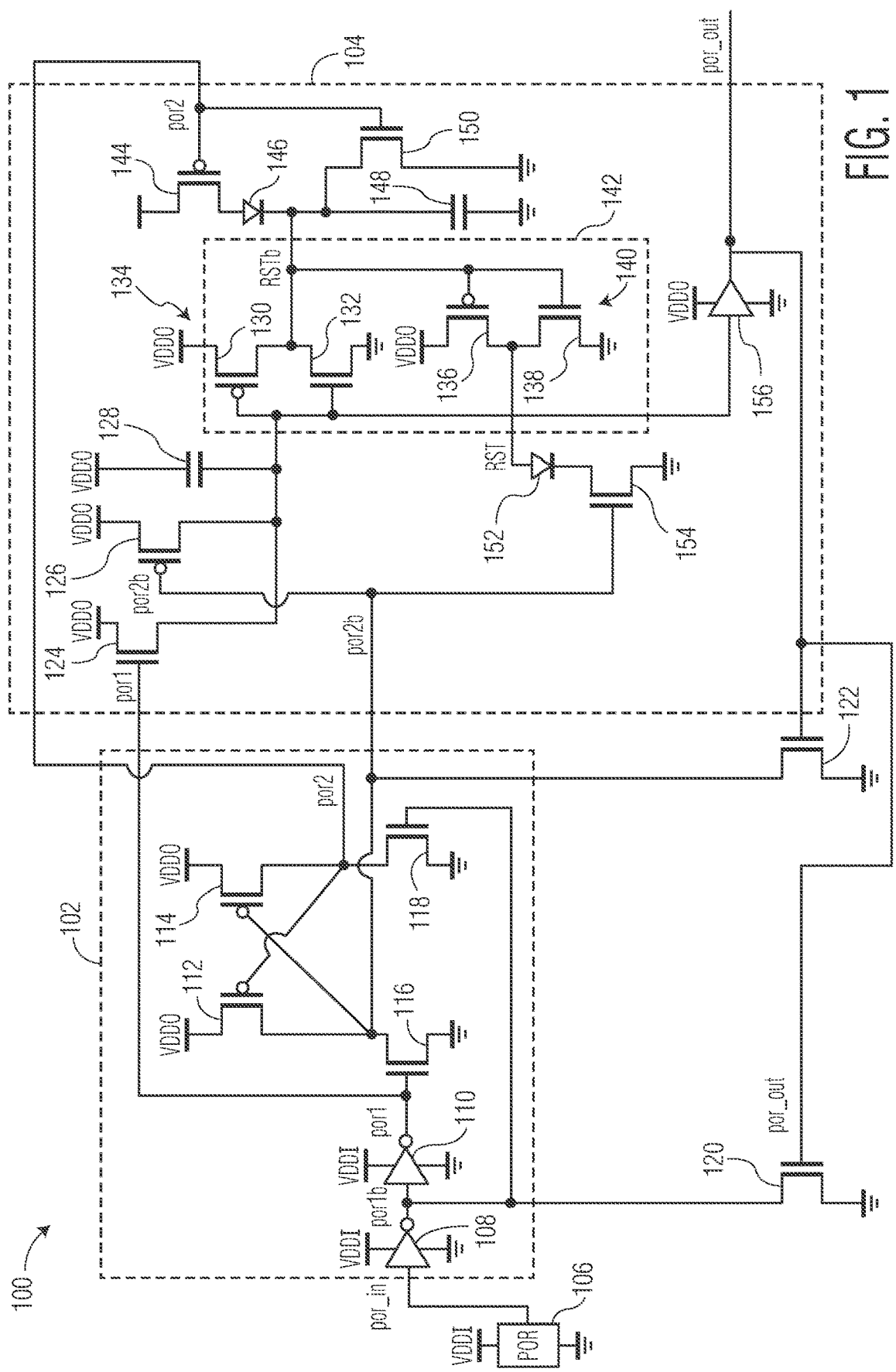
FIG. 1 illustrates, in schematic form, an integrated circuit (IC) having a power on reset (POR) latch circuit integrated with a level-shifter circuit, in accordance with one embodiment of the present invention.

FIG. 1 illustrates, in schematic form, an IC 100 having a POR latch circuit 104, a level shifter circuit 102, and a POR circuit 106. IC 100 includes two voltage domains: a VDDI voltage domain and a VDDO voltage domain. The VDDI voltage domain includes a first power supply terminal powered by a first supply voltage, VDDI, and a second power supply terminal powered by a second power supply voltage, VSS, therefore VDDI is powered by a first power supply voltage differential, VDDI-VSS. The VDDO voltage domain includes a first power supply terminal powered by a third power supply voltage, VDDO, and a second power supply terminal powered by the second power supply voltage, VSS, therefore VDDO is powered by a second power supply voltage differential, VDDO-VSS. Note that the terms VDDI, VDDO, and VSS can be used to refer to the power supply voltage or the corresponding power supply terminals.

Level shifter circuit 102 includes inverters 108 and 110, P-type Metal-on-Semiconductor (PMOS) transistors 112 and 114, and N-type Metal-on-Semiconductor (NMOS) transistors 116 and 118. Level shifter circuit 102 receives an input POR signal, por_in, in the VDDI voltage domain at an input of inverter 108. Por_in is received from POR circuit 106 which may be in the VDDI voltage domain. An output of inverter 108 provides the inverse of por_in as por1$b$ to an input of inverter 110 and to a control electrode of transistor 118. An output of inverter 110 provides the inverse of por1$b$ as por1 to a control electrode of transistor 116. Each of inverters 108 and 110 are powered by VDDI and VSS. The value of por1 corresponds to the value of por_in and is provided as a control signal to POR latch circuit 104. Transistor 112 has a first current electrode coupled to VDDO, and a second current electrode coupled to a first current electrode of transistor 116 and to a control electrode of transistor 114. A second current electrode of transistor 116 is coupled to VSS. Transistor 114 has a first current electrode coupled to VDDO and a second current electrode coupled to a first current electrode of transistor 118 and to a control electrode of transistor 112. A second current electrode of transistor 118 is coupled to VSS. Level shifter circuit 102 provides por2 as a first control signal to POR latch circuit 104, in which por2 is provided by the second current electrode of transistor 114, and provides por2$b$ as a second control signal to POR latch circuit 104, in which por2$b$ is provided by the second current electrode of transistor 112. The signal por2$b$ is the inverse of por2. Level shifter circuit 102 level shifts por1 in the VDDI voltage domain to por2 in the VDDO voltage domain, in which the value of por1 corresponds to por_in, and the value of por2 corresponds to the level shifted value of por1.

POR latch circuit 104 is in the VDDO voltage domain and includes NMOS transistors 124, 150, and 154, PMOS transistors 126 and 144, buffer 156, diodes 152 and 146, capacitors 128 and 148, and a latch 142. POR latch circuit 104 receives por1, por2, and por2$b$ from level shifter circuit 102. Latch 142 has a first storage node, RST, and a second storage node, RSTb, in which the first and second storage nodes are complementary (and may be referred to as first and second latch nodes, respectively). Transistor 124 has a first current electrode coupled to VDDO, a control electrode coupled to receive por1 from level shifter circuit 102, and a second current electrode coupled to RST. Transistor 126 has a first current electrode coupled to VDDO, a control electrode coupled to receive por2b, and a second current electrode coupled to RST. Capacitor 128 has a first terminal coupled to VDDO and a second terminal coupled to RST. Diode 152 has an anode coupled to RST and a cathode coupled to a first current electrode of transistor 154. Transistor 154 has a second current electrode coupled to VSS and a control electrode coupled to receive por2b from level shifter circuit 102. Transistor 144 has a first current electrode coupled to VDDO, a control electrode coupled to receive por2 from level shifter circuit 102, and a second current electrode coupled to an anode of diode 146. A cathode of diode 146 is coupled to RSTb. Transistor 150 has a first current electrode coupled to RSTb, a control electrode coupled to receive por2 from level shifter circuit 102, and a second current electrode coupled to VSS. Capacitor 148 has a first terminal coupled to RSTb and a second terminal coupled to VSS. An input of buffer 156 is coupled to RST and an output of buffer 156 provides an output, por_out, of POR latch circuit 104. Por_out corresponds to the state of storage node RST of latch 142. Buffer 156 is powered by VDDO and VSS. Note that diodes 146 and 152 can each be implemented with one or more diodes, in which any diode can be implemented with a diode-connected transistor.

Latch 142 includes inverters 134 and 140. An output of inverter 140 is coupled to RST and to an input of inverter 134. An output of inverter 134 is coupled to RSTb and to an input of inverter 140. Inverter 134 includes a PMOS transistor 130 and an NMOS transistor 132. Transistor 130 has a first current electrode coupled to VDDO, a control electrode coupled to RST, and a second current electrode coupled to RSTb. Transistor 132 has a first current electrode coupled to RSTb, a control electrode coupled to RST, and a second current electrode coupled to VSS. Inverter 140 includes a PMOS transistor 136 and an NMOS transistor 138. Transistor 136 has a first current electrode coupled to VDDO, a control electrode coupled to RSTb, and a second current electrode coupled to RST. Transistor 138 has a first current electrode coupled to RST, a control electrode coupled to RSTb, and a second current electrode coupled to VSS.

IC 100 also includes an NMOS transistor 120 having a first current electrode coupled to the input of inverter 110, a control electrode coupled to receive por_out, and a second current electrode coupled to VSS, and an NMOS transistor 122 having a first current electrode coupled to the control electrodes of transistors 126 and 154, a control electrode coupled to receive por_out, and a second current electrode coupled to VSS. Transistors 120 and 122 are also referred to as keeper circuits.

Operation of IC 100 will be described in reference to the timing diagram of FIG. 2. When IC 100 is fully powered, POR circuit 106 generates por_in (which is a reliable POR signal), level shifter circuit 102 provides por2 which tracks por_in but level shifted to the VDDO domain, and latch circuit 104 provides a pass through latch for por_in in which por2 is provided as por_out. Once fully powered, diodes 152 and 146 are fully conductive and thus the state of latch 142 is set or reset by the values of por2b and por2 at the control electrodes of transistors 154, 150, 144, and 126. For example, if por_in is a logic level high, por2 and por_out are also logic level highs, and IC 100 enters a reset state. If por_in is a logic level low, por2 and por_out are also logic level lows which allows IC 100 to exit the reset state and enter normal operation. Also, when VDDI is fully powered, there is contention between the keeper circuit 120 and inverter 108, and between keeper circuit 122 and transistor 112. Therefore, when VDDO and VDDI are fully powered, the design of IC 100 is such that keeper circuits 120 and 122 are overridden by level shifter 102, but when only the VDDO domain is fully powered, keeper circuits 120 and 122 override level shifter 102.

Figure 2:
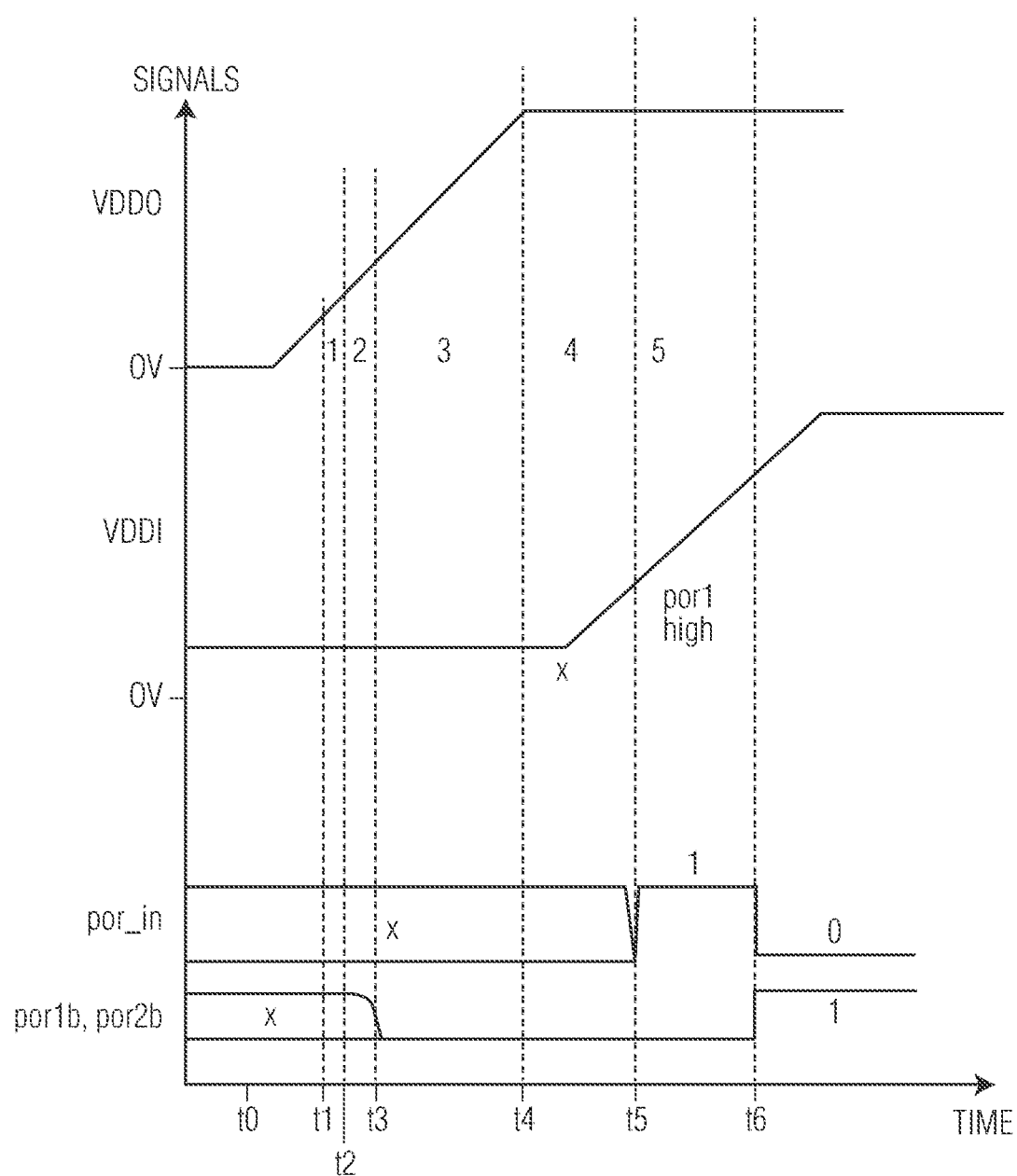
FIG. 2 illustrates, in timing diagram form, various signals of the IC of FIG. 1, in accordance with one embodiment of the present invention.

Referring to FIG. 2, it is assumed that initially, starting at time t0, both VDDO and VDDI are powered down in which VDDO and VDDI are close to 0V and below a threshold voltage level, and por_in, por1b, and por2b are undefined, as indicated by the "x" state. At time t1, POR latch circuit 104 is initially powered up to its known state. POR latch circuit 104 is designed as a capacitively skewed latch. That is, inverters 134 and 140 are designed to be unbalanced such that the known state is RST being high (RST=1) and RSTb being low. For example, transistor 132 may be designed to be larger than transistor 130, and transistor 136 may be designed to be larger than transistor 138. This ensures that as current begins to flow at the initial powering up of VDDO, RST and RSTb head to the desired known state. Also, capacitor 128 operates to pull the RST node to VDDO and capacitor 148 operates to pull the RSTb node to VSS to help POR latch circuit 104 into its known state. While IC 100 is powering up (corresponding to region 1 of FIG. 2), prior to VDDO reaching a diode threshold for diodes 146 and 152, diodes 146 and 152 block any leakage current flowing into nodes RST and RSTb to prevent POR latch circuit 104 from flipping into its undesired state. That is, during this time, diode 146 is off and prevents RSTb from getting pulled up to VDDO and diode 152 is off and prevents RST from getting pulled down to VSS. At time t2, VDDO reaches the threshold voltage of diodes 146 and 152. At this point, POR latch circuit 104 is already in its desired state and is capable of overcoming any leakage current through diodes 146 and 152, which may now be conducting current.

At time t3, VDDO (and thus RST) is high enough to set por_out to a high enough level which turns on keeper circuits 120 and 122. Keeper circuit 120 pulls por1b to VSS and keeper circuit 122 pulls por2b to VSS, as seen at time t3 of FIG. 2. In this manner, the output of POR latch circuit 104, por_out, forces the state of the level shifter outputs, including por1b, por2b, and por2, to known states. Note that at this time, por_in and port, which are generated by the VDDI domain, are still undefined. VDDO continues to power up in region 3 of FIG. 2 while POR latch circuit 104 remains in its desired state (RST=1), with por2b keeping transistor 126 on and pulling up node RST to VDDO and por2 keeping transistor 150 on and pulling node RSTb to VSS, while keeping transistors 154 and 144 off. Any leakage in transistor 124 from VDDO to RST due to por1 being undefined will help maintain the latch circuit in its desired state (RST=1).

At time t4, VDDO is fully powered and POR latch circuit 104 remains in the desired state, and at some time after t4, VDDI starts powering up. At time t5, after VDDI has powered up sufficiently, por_in becomes defined at a logic level high, as illustrated in FIG. 2. At time t5, VDDI is high enough for POR circuit 106 to reliably output por_in as a logic level high (i.e. a "1"). Note that POR circuit 106 sets the value of por_in, and POR circuit 106 also ensures that por_in powers up to a logic level high. With por_in being a logic level high, in region 5 of FIG. 2, por1 and por2 are each defined at a logic level high in response to por_in, and por1b and por2b are defined at a logic level low in response to por_in.

At time t6, IC 100 is ready to enter normal operation in which both VDDO and VDDI are powered up. Therefore, at time t6, POR circuit 106 can negate por_in to a logic level low to allow IC 100 to exit the reset state and enter normal operation. In response to negation of por_in, por1b and por2b overcome keepers 120 and 122 and change to a logic level high, causing por1 and por2 to change to a logic level low, thus turning on transistors 154 and 144. Transistor 154 pulls node RST low and transistor 144 pulls RSTb high, with both diodes 152 and 146 being conductive. In this manner, transistors 154 and 144 operate to reset the state of the latch 104 by resetting or clearing node RST and por_out to a logic level low, disabling keepers 120 and 122. Note that once IC 100 is fully powered, level shifter circuit 102 and latch 104 operates as a pass-through latch for the value of por_in with both diodes 152 and 146 being conductive, and level shifter circuit 102 is able to overcome keepers 120 and 122. For example, the value of por_in determines the values of RST/RSTb and por_out. When por_in is a logic level high, RST and por_out are also logic level highs and when por_in is changed to a logic level low by POR circuit 106, RST and por_out also change to a logic level low.

Note that FIG. 2 describes the situation in which VDDO powers up prior to VDDI powering up, which tends to be a more complicated situation because, as seen in FIG. 2, the signals in the VDDI domain provided to the VDDO domain, such as por_in, por1b, and por2b, start out as undefined and thus unreliable. In this situation, as described above, IC 100 ensures that POR latch circuit 104 powers up into its known state (RST=1) regardless of the values of por2 and por2b, due to the skewed design of inverters 134 and 140 and the presence of capacitors 128 and 148. In the case that VDDI powers up first, note that por_in, and thus por1 and por1b become available and valid prior to VDDO powering up and can put POR latch circuit 104 in the known state (RST=1) by transistor 124. When VDDO subsequently powers up, POR latch circuit 104 enters its known state and can be controlled appropriately by por_in. Note that diodes 152 and 146 ensure that the known state of latch 104 upon initial power up, in any situation, is not changed until VDDO at least exceeds a minimum threshold (e.g. the diode threshold). In an alternate embodiment, note that only one of diodes 146 and 152 is present. For example, in this alternate embodiment, diode 152 and transistor 154 may be present without diode 146 and without transistor 144.

Figure 3:
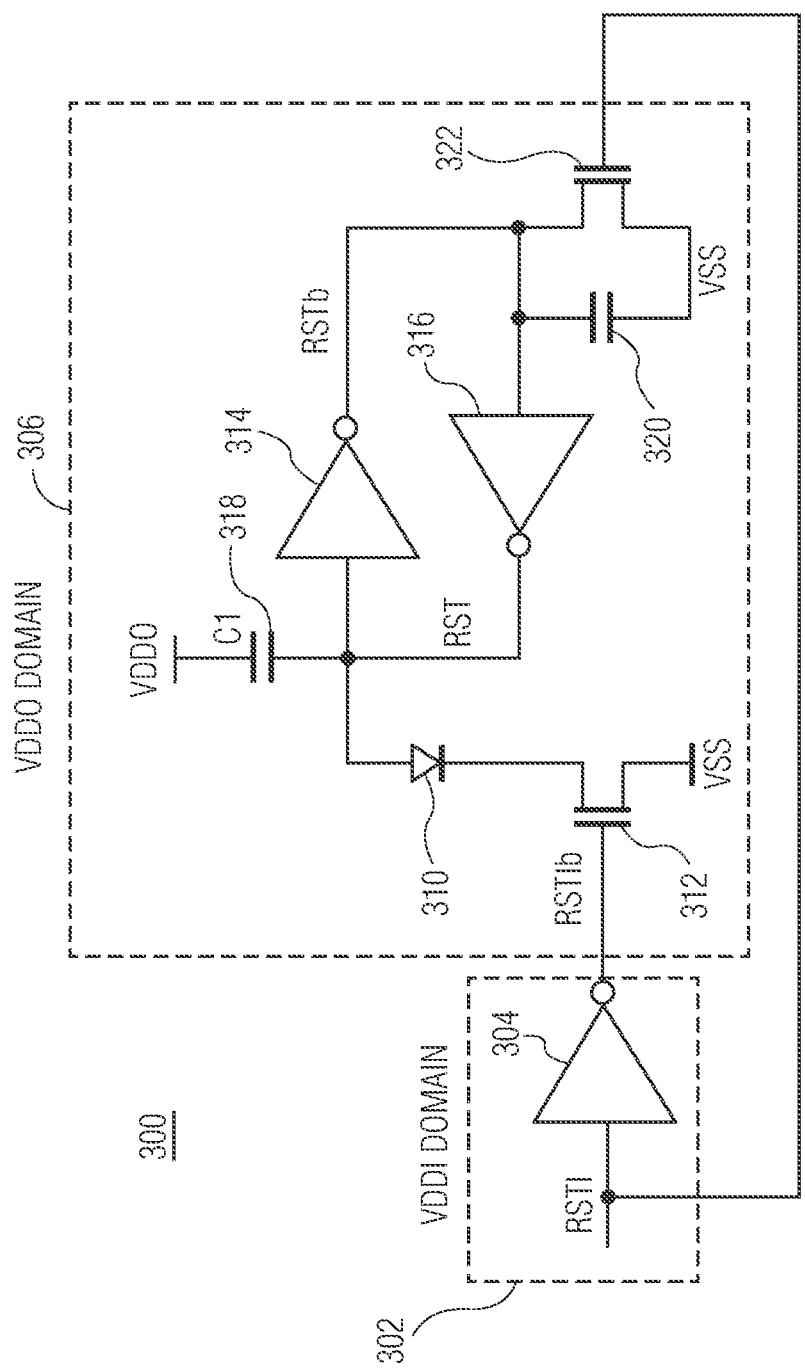
FIG. 3 illustrates, in schematic form, an IC having a power on reset latch circuit, in accordance with one embodiment of the present invention.

FIG. 1 illustrates IC 100 in which POR latch circuit 104 is integrated with level-shifter circuit 102. In this configuration, level-shifter 102 level shifts the por_in input signal which controls RST from the VDDI domain to the VDDO domain, and POR latch circuit 104 latches the appropriate value of RST as determined by por_in. FIG. 3 illustrates an IC 300 which includes a level-shifting POR latch circuit 306. As with IC 100, IC 300 includes two voltage domains, VDDI and VDDO, as described above in reference to FIG. 2. Therefore, the same description of VDDI and VDDO and the corresponding power supply voltages and power supply terminals apply to FIG. 3 as well.

VDDI domain includes POR circuitry 302 which provides a reset input signal, RSTI, and the inverse of the reset input signal, RSTIb, to the VDDO domain. In the illustrated embodiment, POR circuitry 302 includes an inverter 304 which is coupled to receive RSTI and provide RSTIb. Note that a POR circuit such as POR circuit 106 in the VDDI domain can generate RSTI which is received by inverter 304. VDDO domain includes a POR latch circuit 306 which includes NMOS transistors 312 and 322, PMOS transistor 308, diode 310, capacitors 318 and 320, and a latch formed by inverters 314 and 316. POR latch circuit 306 has a first storage node, RST, and a second storage node, RSTb, in which the first and second storage nodes are complementary. Capacitor 318 has a first terminal coupled to VDDO and a second terminal coupled to RST. Diode 310 has an anode coupled to RST and a cathode coupled to a first current electrode of transistor 312. Transistor 312 has a second current electrode coupled to VSS, and a control electrode coupled to receive RSTIb from the VDDI domain. Transistor 322 has a first current electrode coupled to RST, a control electrode coupled to receive RSTIb from the VDDI domain, and a second current electrode coupled to VSS. Capacitor 320 has a first terminal coupled to RSTb and a second terminal coupled to VSS.

Similar to latch 142 of IC 100 described above, the latch formed by 314 and 316 is designed such that upon initial power up of VDDO, the latch stores a known state, corresponding to RST being at a logic level high (RST=1). Transistor 322 provides DC pull-downs to skew the latch during a slow power ramp of VDDO. Once VDDI is powered, RSTI serves as the primary POR, and transistor 312, transistor 322, the PMOS transistors of inverters 314 and 316 operate as a level-shifter for RSTI from the VDDI domain to the VDDO domain. Diode 310 prevents any leakage current of transistor 312 from overriding the latch's skew towards storing a logic level one at the RST node. As with diodes 152 and 156, diode 310 blocks current at least until VDDO reaches a minimum threshold (e.g. a diode threshold) to prevent the latch from switching from its known state upon initial power up.

For example, when VDDI is powered prior to VDDO being powered, circuit 306 operates to level-shift RSTI in which the state of RST is determined by the values of RSTI and RSTIb. With VDDI being powered, RSTI and RSTIb are defined and reliable. However, if VDDI is unpowered, the value of RSTI and RSTIb are unreliable (similar to how the values of por_in, por1, por1b, por2, and por2b are undefined before VDDI is sufficiently powered). In the case where VDDI is unpowered and VDDO is powering up, similar to the situation of VDDI and VDDO illustrated in FIG. 2, inverters 314 and 316 are designed to start up into its known state (as was described above with respect to inverters 134 and 140) in which capacitor 318 operates to pull up the RST node towards VDDO and capacitor 320 operates to pulls node RSTb towards VSS. That is, POR latch circuit 306 may also be implemented as a capacitively skewed latch.

Diode 310, similar to diode 152, blocks leakage current in transistor 312 from overcoming coupling currents from capacitor 318 and the leakage in inverters 314 and 316. In this manner, diode 310 prevents RST from changing to a second state from its known start up state, regardless of the value of RSTI and RSTIb, which are still undefined. Once VDDO is powered, diode 310 is conductive and inverters 314 and 316 retain the start of RST. Once VDDI is powered, RSTI and RSTIb are defined, and RSTI can be negated to a logic level low to allow IC 300 to exit the reset state and enter normal operation. For example, in response to RSTI being negated, RSTIb is asserted to a logic level high, turning on transistor 312. With diode 310 being conductive, transistor 312 pulls RST to VSS, resetting RST to a logic level low (similar to the functionality of transistor 154 in POR latch circuit 104 of FIG. 1). At this point, with the reset signal negated and VDDI and VDDO being fully powered up, IC 300 can enter normal operation.

Therefore, by now it can be appreciated how POR latches in a first voltage domain powered by a first voltage supply, which receive inputs from a second voltage domain powered by a second voltage supply, can be used to ensure the desired reset state is latched upon initial power up of either the first or second voltage domains. A current path between a first latch node (or storage node) of the POR latch (such as the RST node in FIGS. 1 and 3 above) can include a diode (such as diode 310 or 152) and a resetting device (such as device 312 or 154). The diode ensures that the initial reset state is not changed as the first voltage supply powers up. That is, while the first voltage supply is below a minimum threshold, the diode is in a non-conductive state and prevents leakage current in the resetting device from resetting the first latch node of the POR latch, even when the inputs from the second voltage domain are undefined. Once the first voltage supply node reaches the minimum threshold, the latch circuit (e.g. latch circuit 142 or the latch formed by inverters 314 and 316) is capable of securing its latched reset state. Upon the first and second voltage domains being fully powered, the inputs from the second voltage domain are defined and reliable and are capable of clearing or negating the reset state of the latch so as to enter normal operation. In one embodiment, the POR latch may also include a second current path between a second latch node (or storage node) of the POR latch (such as the RSTb node in FIGS. 1 and 3 above) which includes a second diode (such as diode 146) and a second resetting device (such as device 144). The second diode further ensures that the initial reset state is not changed as the first voltage supply powers up by blocking leakage currents in the second resetting device.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "b" following the name. For example, RST with a bar over the letters is the same as RSTb. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of IC 100 or IC 300 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, IC 100 or IC 300 can include any number of different voltage domains in which one or more voltage domains may include a POR latch circuit. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a circuit includes a latch circuit that powers up to a known latch state and includes a second latch state, and the latch circuit includes a latch including a first latch node and a second latch node, the first latch node and the second latch node are at first complementary node states in the known latch state and are at second complementary node states in the second latch state, the latch including power supply terminals for being powered at a first power supply voltage differential of a first voltage domain; a current path between the first latch node and a power supply terminal; a latch resetting device located in the current path, the latch resetting device including a control input to receive a signal to place the latch resetting device in a conductive state to pull the first latch node towards a power supply voltage of the power supply terminal coupled to the current path to place the latch circuit in the second latch state; a diode located in the current path, the diode inhibiting current flow in the first current path between the first latch node and the power supply terminal when the power supply voltage differential is below a threshold voltage during power up. In one aspect of this embodiment, the latch circuit further includes a second current path from the second latch node to a second power supply terminal; a second latch resetting device located in the second current path, the second latch resetting device including a control input to receive a second signal to place the second latch resetting device in a conductive state to pull the second latch node towards a power supply voltage of the second power supply terminal coupled to the second current path to place the latch circuit in the second latch state; a second diode located in the second current path, the second diode inhibiting current flow in the second current path between the second latch node and the second power supply terminal when the power supply voltage differential is below the threshold voltage during power up. In another aspect, diode inhibiting current flow prevents the first latch node from transitioning to a node state of the second complementary node states when the power supply voltage differential is below the threshold voltage during power up. In another aspect, the circuit further includes a level shifter including a first stage and a second stage, the first stage for being powered at the first power supply voltage differential of the first voltage domain, the second stage being power by a second supply voltage differential of a second voltage domain, wherein the first stage includes an output to provide the signal. In a further aspect, the circuit further includes a keeper device coupled in a current path between a node of the level shifter and a power supply terminal, the keeper device including a control input controlled by an output of the latch circuit, the keeper device pulling the node of the level shifter towards the voltage of the power supply terminal during power up to inhibit the signal from going to a state to switch the latch circuit to the second latch state. In a further aspect, the node is a node of the first stage. In yet a further aspect, the node is a node of the second stage. In another further aspect, the latch circuit further includes a second current path from the first latch node to a second power supply terminal; a latch setting device located in the second current path, the latch setting device including a control input to receive a second signal to place the latch setting device in a conductive state to pull the first latch node towards a power supply voltage of the second power supply terminal to place the latch circuit in the known latch state. In another aspect of the above embodiment, after the power supply voltage differential passes the threshold voltage during power up, the signal transitions to a state to make the latch resetting device conductive to pull the first latch node towards the power supply voltage of the power supply terminal coupled to the current path through the diode to place the latch circuit in the second latch state. In another aspect, after the power supply voltage passes the threshold voltage during power up, the signal transitions to a state to make the latch resetting device conductive to pull the first latch node towards the power supply voltage of the power supply terminal coupled to the current path through the diode to place the latch circuit in the second latch state in response to a power on reset signal switching from a first state to a second state. In a further aspect, the power on reset signal is generated by circuitry of a second voltage domain different form the first voltage domain. In another aspect, the diode is implemented as a bipolar configured diode with one junction reversed biased. In another aspect, the signal is generated by circuitry of a second voltage domain different than the first voltage domain. In another aspect, the latch circuit further includes a second current path from the second latch node to the power supply terminal; a latch setting device located in the second current path, the latch setting device including a control input to receive a second signal to place the latch setting device in a conductive state to pull the second latch node towards a power supply voltage of the power supply terminal to place the latch circuit in the known latch state. In a further aspect, the second signal is an inverted version of the first signal.

In another embodiment, a method of powering up a circuit includes powering up a latch circuit in a known latch state by applying a first power supply voltage differential of a first voltage domain across power supply terminals of the latch circuit; and inhibiting current by a diode in a current path between a latch node of the latch circuit and a power supply terminal when the power supply voltage differential is below a threshold voltage during the powering up, wherein the inhibiting preventing the latch circuit from switching from the known latch state during the powering up. In one aspect, the method further includes, after the powering up, making conductive a resetting device in the first current path to pull a voltage of the latch node towards a voltage of the power supply terminal through the diode to switch the latch circuit from the known latch state to a second latch state. In a further aspect, the making conductive includes applying a signal in a resetting state to a control terminal of the resetting device, wherein the signal is generated by a stage of level shifter, the stage being of the first voltage domain. In another aspect, the making conductive includes applying a signal in a resetting state to a control terminal of the resetting device, wherein the signal is generated by circuit of a second voltage domain, the second voltage domain being different than the first voltage domain. In another aspect, the applying the signal in a resetting state is performed in response to a power on reset signal changing states to indicate that at least the first voltage domain and a second voltage domain have powered up.

What is claimed is:
1. A circuit comprising:
a latch circuit that powers up to a known latch state and includes a second latch state, the latch circuit comprising:
 a latch including a first latch node and a second latch node, the first latch node and the second latch node are at first complementary node states in the known latch state and are at second complementary node states in the second latch state, the latch including power supply terminals for being powered at a first power supply voltage differential of a first voltage domain;
 a current path between the first latch node and a power supply terminal;
 a latch resetting device located in the current path, the latch resetting device including a control input to receive a signal to place the latch resetting device in a conductive state to pull the first latch node towards a power supply voltage of the power supply terminal coupled to the current path to place the latch circuit in the second latch state;
 a diode located in the current path, the diode inhibiting current flow in the first current path between the first latch node and the power supply terminal when the power supply voltage differential is below a threshold voltage during power up; and a level shifter including a first stage and a second stage, the first stage for being powered at the first power supply voltage differential of the first voltage domain, the second stage being power by a second supply voltage differential of a second voltage domain, wherein the first stage includes an output to provide the signal.

2. The circuit of claim 1 wherein the latch circuit further comprises:
a second current path from the second latch node to a second power supply terminal;
a second latch resetting device located in the second current path, the second latch resetting device including a control input to receive a second signal to place the second latch resetting device in a conductive state to pull the second latch node towards a power supply voltage of the second power supply terminal coupled to the second current path to place the latch circuit in the second latch state;
a second diode located in the second current path, the second diode inhibiting current flow in the second current path between the second latch node and the second power supply terminal when the power supply voltage differential is below the threshold voltage during power up.

3. The circuit of claim 1 wherein the diode inhibiting current flow prevents the first latch node from transitioning to a node state of the second complementary node states when the power supply voltage differential is below the threshold voltage during power up.

4. The circuit of claim 1 further comprising:
a keeper device coupled in a current path between a node of the level shifter and a power supply terminal, the keeper device including a control input controlled by an output of the latch circuit, the keeper device pulling the node of the level shifter towards the voltage of the power supply terminal during power up to inhibit the signal from going to a state to switch the latch circuit to the second latch state.

5. The circuit of claim 4 wherein the node is a node of the first stage.

6. The circuit of claim 4 wherein the node is a node of the second stage.

7. The circuit of claim 4 wherein the latch circuit further comprises:
a second current path from the first latch node to a second power supply terminal;
a latch setting device located in the second current path, the latch setting device including a control input to receive a second signal to place the latch setting device in a conductive state to pull the first latch node towards a power supply voltage of the second power supply terminal to place the latch circuit in the known latch state.

8. The circuit of claim 1 wherein after the power supply voltage differential passes the threshold voltage during power up, the signal transitions to a state to make the latch resetting device conductive to pull the first latch node towards the power supply voltage of the power supply terminal coupled to the current path through the diode to place the latch circuit in the second latch state.

9. The circuit of claim 1 wherein after the power supply voltage passes the threshold voltage during power up, the signal transitions to a state to make the latch resetting device conductive to pull the first latch node towards the power supply voltage of the power supply terminal coupled to the current path through the diode to place the latch circuit in the second latch state in response to a power on reset signal switching from a first state to a second state.

10. The circuit of claim 9 wherein the power on reset signal is generated by circuitry of a second voltage domain different form the first voltage domain.

11. A circuit comprising:
a latch circuit that powers up to a known latch state and includes a second latch state, the latch circuit comprising:
a latch including a first latch node and a second latch node, the first latch node and the second latch node are at first complementary node states in the known latch state and are at second complementary node states in the second latch state, the latch including power supply terminals for being powered at a first power supply voltage differential of a first voltage domain;
a current path between the first latch node and a power supply terminal;
a latch resetting device located in the current path, the latch resetting device including a control input to receive a signal to place the latch resetting device in a conductive state to pull the first latch node towards a power supply voltage of the power supply terminal coupled to the current path to place the latch circuit in the second latch state;
a diode located in the current path, the diode inhibiting current flow in the first current path between the first latch node and the power supply terminal when the power supply voltage differential is below a threshold voltage during power up,
wherein the diode is implemented as a bipolar configured diode with one junction reversed biased.

12. A circuit comprising:
a latch circuit that powers up to a known latch state and includes a second latch state, the latch circuit comprising:
a latch including a first latch node and a second latch node, the first latch node and the second latch node are at first complementary node states in the known latch state and are at second complementary node states in the second latch state, the latch including power supply terminals for being powered at a first power supply voltage differential of a first voltage domain;
a current path between the first latch node and a power supply terminal;
a latch resetting device located in the current path, the latch resetting device including a control input to receive a signal to place the latch resetting device in a conductive state to pull the first latch node towards a power supply voltage of the power supply terminal coupled to the current path to place the latch circuit in the second latch state;
a diode located in the current path, the diode inhibiting current flow in the first current path between the first latch node and the power supply terminal when the power supply voltage differential is below a threshold voltage during power up,
wherein the signal is generated by circuitry of a second voltage domain different than the first voltage domain.

13. The circuit of claim 1 wherein the latch circuit further includes:
a second current path from the second latch node to the power supply terminal;

a latch setting device located in the second current path, the latch setting device including a control input to receive a second signal to place the latch setting device in a conductive state to pull the second latch node towards a power supply voltage of the power supply terminal to place the latch circuit in the known latch state.

14. The circuit of claim 13 wherein the second signal is an inverted version of the first signal.

15. The circuit of claim 12 wherein the latch circuit further includes:
a second current path from the second latch node to the power supply terminal;
a latch setting device located in the second current path, the latch setting device including a control input to receive a second signal to place the latch setting device in a conductive state to pull the second latch node towards a power supply voltage of the power supply terminal to place the latch circuit in the known latch state.

16. The circuit of claim 15 wherein the second signal is an inverted version of the first signal.

17. The circuit of claim 11 wherein the latch circuit further comprises:
a second current path from the second latch node to a second power supply terminal;
a second latch resetting device located in the second current path, the second latch resetting device including a control input to receive a second signal to place the second latch resetting device in a conductive state to pull the second latch node towards a power supply voltage of the second power supply terminal coupled to the second current path to place the latch circuit in the second latch state;
a second diode located in the second current path, the second diode inhibiting current flow in the second current path between the second latch node and the second power supply terminal when the power supply voltage differential is below the threshold voltage during power up.

18. A circuit comprising:
a latch circuit that powers up to a known latch state and includes a second latch state, the latch circuit comprising:
a latch including a first latch node and a second latch node, the first latch node and the second latch node are at first complementary node states in the known latch state and are at second complementary node states in the second latch state, the latch including power supply terminals for being powered at a first power supply voltage differential of a first voltage domain;
a current path between the first latch node and a power supply terminal;
a diode located in the current path and having a first terminal coupled to the first latch node;
a latch resetting device located in the current path, the latch resetting device including a transistor having a first current electrode coupled to a second terminal of the diode, a second current electrode coupled to the power supply terminal, and a control electrode coupled to receive a signal to place the transistor in a conductive state to pull the first latch node towards a power supply voltage of the power supply terminal to place the latch circuit in the second latch state,
wherein the diode inhibits current flow in the first current path between the first latch node and the power supply terminal when the power supply voltage differential is below a threshold voltage during power up.

19. The circuit of claim 18, wherein the first terminal of the diode is characterized as the anode and the second terminal of the diode is characterized as the cathode.

20. The circuit of claim 18 wherein the latch circuit further comprises:
a second current path from the second latch node to a second power supply terminal;
a second diode located in the second current path and having a cathode coupled to the second latch node;
a second latch resetting device located in the second current path, the second latch resetting device including a second transistor having a first current electrode coupled to the second power supply terminal, a second current electrode coupled to an anode of the second diode, and a control electrode coupled to receive a second signal to place the second transistor in a conductive state to pull the second latch node towards a power supply voltage of the second power supply terminal coupled to the second current path to place the latch circuit in the second latch state,
wherein the second diode inhibits current flow in the second current path between the second latch node and the second power supply terminal when the power supply voltage differential is below the threshold voltage during power up.

* * * * *